United States Patent
Cheng et al.

(10) Patent No.: US 9,666,563 B2
(45) Date of Patent: May 30, 2017

(54) METAL TO METAL BONDING FOR STACKED (3D) INTEGRATED CIRCUITS

(71) Applicant: International Business Machines Corporation, Armonk, NY (US)

(72) Inventors: Tien-Jen Cheng, Bedford, NY (US); Mukta G. Farooq, Hopewell Junction, NY (US); John A. Fitzsimmons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/958,226

(22) Filed: Dec. 3, 2015

(65) Prior Publication Data
US 2016/0086915 A1    Mar. 24, 2016

Related U.S. Application Data

(63) Continuation of application No. 14/485,674, filed on Sep. 13, 2014, now Pat. No. 9,515,051, which is a
(Continued)

(51) Int. Cl.
*H01L 25/065* (2006.01)
*H01L 23/48* (2006.01)
(Continued)

(52) U.S. Cl.
CPC ........ *H01L 25/0657* (2013.01); *H01L 23/481* (2013.01); *H01L 23/488* (2013.01); *H01L 23/5386* (2013.01); *H01L 24/03* (2013.01); *H01L 24/05* (2013.01); *H01L 24/32* (2013.01); *H01L 24/80* (2013.01); *H01L 24/83* (2013.01); *H01L 25/50* (2013.01); *H01L 24/08* (2013.01); *H01L 24/94* (2013.01); *H01L 2224/038* (2013.01); *H01L 2224/039* (2013.01);
(Continued)

(58) Field of Classification Search
CPC ..... H01L 25/0657; H01L 23/481; H01L 4/32; H01L 24/05; H01L 23/5226; H01L 21/76898; H01L 21/2885; H01L 23/49827; H01L 21/76843; H01L 21/76864; H01L 21/76873; H01L 21/76877; H01L 23/53233
USPC .................. 257/774, 777, 734, 762; 438/687
See application file for complete search history.

(56) References Cited

U.S. PATENT DOCUMENTS

| 4,309,474 A | 1/1982 | Hodes et al. |
| 6,284,567 B1 | 9/2001 | Park |

(Continued)

FOREIGN PATENT DOCUMENTS

JP    10-256258 A    9/1998

OTHER PUBLICATIONS

PCT/US2014/010442, International Search Report and Written Opinion of the International Searching Authority, May 9, 2014.
(Continued)

*Primary Examiner* — David Vu
*Assistant Examiner* — Mouloucoulaye Inoussa
(74) *Attorney, Agent, or Firm* — Matthew C. Zehrer

(57) ABSTRACT

The present invention provides a stabilized fine textured metal microstructure that constitutes a durable activated surface usable for bonding a 3D stacked chip. A fine-grain layer that resists self anneal enables metal to metal bonding at moderate time and temperature and wider process flexibility.

19 Claims, 4 Drawing Sheets

Related U.S. Application Data continuation of application No. 13/736,984, filed on Jan. 9, 2013, now Pat. No. 8,916,448.

(51) Int. Cl.
*H01L 23/00* (2006.01)
*H01L 23/488* (2006.01)
*H01L 23/538* (2006.01)
*H01L 25/00* (2006.01)

(52) U.S. Cl.
CPC .............. *H01L 2224/0346* (2013.01); *H01L 2224/03464* (2013.01); *H01L 2224/03825* (2013.01); *H01L 2224/03829* (2013.01); *H01L 2224/05005* (2013.01); *H01L 2224/05017* (2013.01); *H01L 2224/05025* (2013.01); *H01L 2224/0557* (2013.01); *H01L 2224/05073* (2013.01); *H01L 2224/05082* (2013.01); *H01L 2224/05147* (2013.01); *H01L 2224/05541* (2013.01); *H01L 2224/05551* (2013.01); *H01L 2224/05557* (2013.01); *H01L 2224/05572* (2013.01); *H01L 2224/05644* (2013.01); *H01L 2224/05647* (2013.01); *H01L 2224/05655* (2013.01); *H01L 2224/08145* (2013.01); *H01L 2224/27464* (2013.01); *H01L 2224/27831* (2013.01); *H01L 2224/32145* (2013.01); *H01L 2224/32146* (2013.01); *H01L 2224/80203* (2013.01); *H01L 2224/80447* (2013.01); *H01L 2224/80895* (2013.01); *H01L 2224/83895* (2013.01); *H01L 2224/94* (2013.01); *H01L 2225/06513* (2013.01); *H01L 2225/06541* (2013.01); *H01L 2924/00014* (2013.01); *H01L 2924/1011* (2013.01); *H01L 2924/3511* (2013.01)

(56) References Cited

U.S. PATENT DOCUMENTS

| 6,569,769 | B1 * | 5/2003 | Economikos ..... H01L 21/31053 252/79.1 |
|---|---|---|---|
| 7,015,580 | B2 | 3/2006 | Fitzsimmons et al. |
| 7,291,915 | B2 | 11/2007 | Sugawa et al. |
| 7,485,968 | B2 | 2/2009 | Enquist et al. |
| 7,939,369 | B2 | 5/2011 | Farooq et al. |
| 8,021,921 | B2 | 9/2011 | Lin et al. |
| 8,536,047 | B2 | 9/2013 | Zhang et al. |
| 8,748,288 | B2 | 6/2014 | Farooq et al. |
| 2002/0096768 | A1 | 7/2002 | Joshi et al. |
| 2002/0105082 | A1 * | 8/2002 | Andricacos ....... H01L 21/76843 257/758 |
| 2002/0192363 | A1 | 12/2002 | Bahn et al. |
| 2003/0015793 | A1 * | 1/2003 | Merchant ......... H01L 21/76843 257/734 |
| 2003/0145458 | A1 * | 8/2003 | Tani ...................... H05K 3/389 29/830 |
| 2006/0071335 | A1 | 4/2006 | Kotaki et al. |
| 2006/0223231 | A1 | 10/2006 | Koiwa et al. |
| 2006/0246436 | A1 | 11/2006 | Ohno et al. |
| 2008/0213945 | A1 | 9/2008 | Abe et al. |
| 2009/0134501 | A1 | 5/2009 | Ganitzer et al. |
| 2009/0283903 | A1 | 11/2009 | Park |
| 2010/0144118 | A1 | 6/2010 | Yang et al. |
| 2010/0283122 | A1 | 11/2010 | Pulugurtha et al. |
| 2010/0289144 | A1 | 11/2010 | Farooq et al. |
| 2011/0260317 | A1 | 10/2011 | Lu et al. |
| 2011/0284386 | A1 | 11/2011 | Willey et al. |
| 2012/0115305 | A1 | 5/2012 | Peng et al. |
| 2012/0199968 | A1 * | 8/2012 | Park ........................ H01L 24/19 257/737 |
| 2012/0252162 | A1 | 10/2012 | Sadaka et al. |
| 2013/0216302 | A1 | 8/2013 | Yanase et al. |
| 2014/0011324 | A1 | 1/2014 | Liu et al. |
| 2014/0191418 | A1 * | 7/2014 | Cheng .................. H01L 23/488 257/777 |

OTHER PUBLICATIONS

"Correlation of Stress and Texture Evolution During Self-and Thermal Annealing of Electroplated Cu Films," H. Lee, et al., Journal of Applied Physics, vol. 93, No. 7, Apr. 1, 2003, pp. 3796-3804.

"Wafer and Die Bonding Technologies for 3D Integration," Dr. Shari Farrens, SUSS MicroTec, Waterbury Center, VT, MRS Fall 2008 Proceedings.

Final Office Action, dated May 23, 2016, U.S. Appl. No. 14/485,674.

* cited by examiner

METAL TO METAL BONDING FOR STACKED (3D) INTEGRATED CIRCUITS

RELATED APPLICATIONS

This application is a continuation U.S. Ser. No. 14/485,674 filed Sep. 13, 2014 which is a continuation of U.S. Ser. No. 13/736,984 filed Jan. 9, 2013, now U.S. Pat. No. 8,916,448, the entire contents of which are incorporated herein by reference.

BACKGROUND

Embodiments of present invention relate generally to three dimensional (3D) integrated circuits, and more particularly to enabling the metal-to-metal bonding of integrated circuit substrates at low temperature and pressure.

The semiconductor industry continues to drive toward greater functionality and speed of integrated circuits. For the most part, such improvements have been achieved by scaling the feature size such that more smaller devices can fit in a given area. But such scaling cannot continue indefinitely because devices are now approaching atomic dimensions. Furthermore, as the density has increased, so has the complexity and length of the interconnect circuitry, causing increases in both circuit resistance-capacitance (RC) delay and power consumption. Three-dimensional integrated circuits—that is, stacked chips bonded together—provides an opportunity to overcome these limitations.

FIG. 1 illustrates a 3D stack 100 in which two semiconductor die are bonded together. Each die may be one of a plurality of dice on a whole or partial semiconductor wafer, such that 3D stack 100 can represent any combination such as wafer to wafer, die to wafer, or die to die. A first die 110 includes a semiconductor substrate 106 in which at least one semiconductor device 101 formed and interconnect wiring layer 102, and a second die 120 includes one or more TSVs (through substrate vias) 121 for passing power or signals entirely through the second die 120 to the devices 101 of the first die. The interconnect wiring 102 is embedded in back end of the line (BEOL) dielectric layers 103, formed on substrate 106. The interconnect wiring and TSVs include a conductive core, which can be formed of copper. The core is typically separated from the surrounding materials (e.g., the substrate wafer or dielectric layers) by liner and barrier layers.

The wiring and TSVs are conventionally formed by plating copper onto a seed layer that has been deposited such as by PVD or ALD. The grain size of the plated copper depends on the plating conditions and the thickness of the deposition. This microstructure is known to "self-anneal", that is, the thermodynamics favor grain growth, even at room temperature, and even though this grain growth induces a tensile stress. See Lee and Wong, "Correlation of stress and texture evolution during self- and thermal annealing of electroplated Cu films", *J. Appl. Phys* 93:4 3796-3804. Such stresses can cause distortions such as warpage of a silicon wafer. Typical semiconductor processing includes a thermal anneal to accelerate the atomic rearrangement and bring the plated copper to an equilibrium state.

Controlling the anneal enables further high fidelity processing such as alignment and bonding of two substrates to form the 3D stacked structure of FIG. 1. First die 110 (after completing BEOL processing to form layer 103 with interconnect wiring 102) and second die 120 can be bonded by thermocompression bonding between a plated metal (e.g., 105) on the bonding surface 104 of the first die and a plated metal (e.g., 125) on the bonding surface 124 of the second die. This method may be used in die to die, or die to wafer, as well as for wafer to wafer bonding for 3D applications. The facing surfaces of the two die can be formed with metal regions, for example, a mirror image pattern of copper regions as depicted in FIG. 2. These metal regions can constitute part of the circuitry of the final 3D stack, or they can be created strictly as bonding regions. Metal bonding to form the 3C integrated circuit stack can be achieved by holding the stack together at temperature of at least 350-400 C for at least 30 to 60 minutes.

Unfortunately, such conditions can exceed the thermal budget of delicate integrated circuitry which cannot be exposed, or at least not for extended time, to high temperature. Farrens reports in "Wafer and Die Bonding Technologies for 3D Integration", MRS Fall 2008 Proceedings E, that lower temperature atomic diffusion of all fcc metals is primarily along grain boundaries. Bonding a 3D stack at lower temperatures would permit a wider selection of devices and materials, but has not been possible because, as noted above, conventional processing promotes grain growth such that a plated copper surface has a very low concentration of grain boundaries. Even without a thermal anneal, thermodynamics drives grain growth and within a very short time converts the surface microstructure of plated copper such that metal to metal bonding at temperature below 350 C is impractical.

A need remains to achieve reliable metal bonding in reasonable time at less stressful conditions.

BRIEF SUMMARY

Embodiments of present invention enables metal to metal bonding at lower bond temperature and time combination, enabling a lower thermal budget.

According to an embodiment, metal to metal bonding can be enabled by electroless plating a metal surface to form a bonding layer wherein an average grain size of said bonding layer is smaller than an average grain size of said metal surface. According to a further embodiment, the metal surface can be oxidized by exposure to $H_2O_2$, TEAH or TMAH to create a roughened surface prior to such electroless plating.

A custom electroless plating solution may include a reducing agent poison. The custom electroless plating solution may include a deposition poison. The plating solution may include a contaminant species that inhibits grain growth in a deposited layer.

According to another embodiment, a 3D stacked structure includes a first die bonded to a second die by a metallic bond. The first die includes metal wiring structure formed within a one or more dielectric layers disposed on a semiconductor substrate within which at least one semiconductor device has been formed, and the second die includes a semiconductor substrate having at least one contact pad. The metallic bond is at an interface between said metal structure and said contact pad. A species that inhibits plating other than oxygen is present at the interface at a concentration substantially higher than the concentration of such species within either of said metal structure or said contact pad.

In another embodiment, a 3D structure includes a bonding layer upon a metal surface. In yet another embodiment, an interconnect for connecting a first semiconductor die to a second semiconductor die includes the bonding layer upon the metal surface. The average grain size of the bonding layer is smaller than an average grain size of the metal surface.

BRIEF DESCRIPTION OF SEVERAL VIEWS OF THE DRAWINGS

Exemplary embodiments may best be understood by reference to the detailed description in conjunction with the accompanying figures. The Figures are provided for illustration and are not drawn to scale.

DETAILED DESCRIPTION

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. Similarly, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Additionally, to the extent a feature is described to be horizontal or vertical, that orientation is with respect to a generally planar major surface of the substrate which can be in the form of a wafer or disk.

The present invention promotes metal to metal bonding at lower temperature by forming a layer of fine textured structure on the bonding surface. Fine metal grains can be deposited and arranged to create a layer of fine textured structure capable of metal to metal surface bonding at a reduced temperature, that is, at a temperature lower than the temperature normally required for metal to metal bonding. A plating step ordinarily is conducted in such a manner so that clean surfaces are maintained to enable even metal deposition and growth. Even if a fine metal grain structure could be formed on such a plated surface, the microstructure is not durable because thermodynamics drives the fine grains to "self-anneal", that is, to join together to form larger grains constituting a lower energy state. The present invention provides a stabilized fine textured metal microstructure that constitutes a durable activated surface even after significant passage of time. Such a fine textured structure can enable metal bonding at lower thermal budget and can be achieved in various ways.

Figure 1:
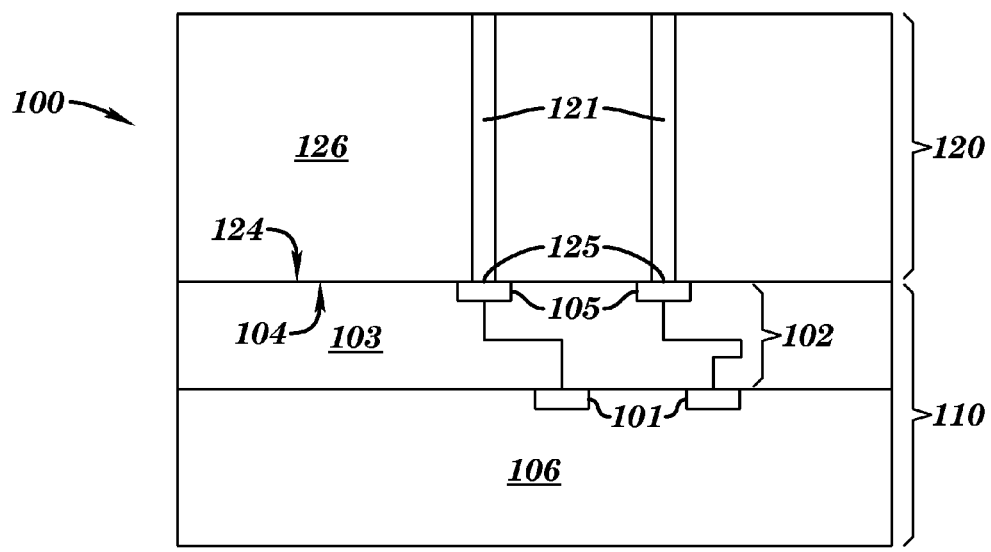
FIG. 1 depicts a 3D integrated circuit.
Figure 2:
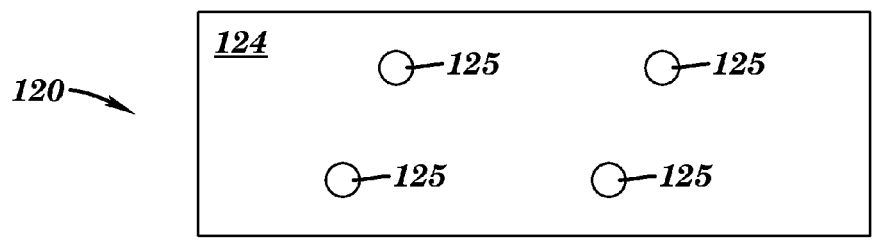
FIG. 2 illustrates the bonding surfaces of two substrates comprising a 3D integrated circuit structure wherein the surfaces have mirror image metal regions within a field of non-conductive material.
Figure 2:
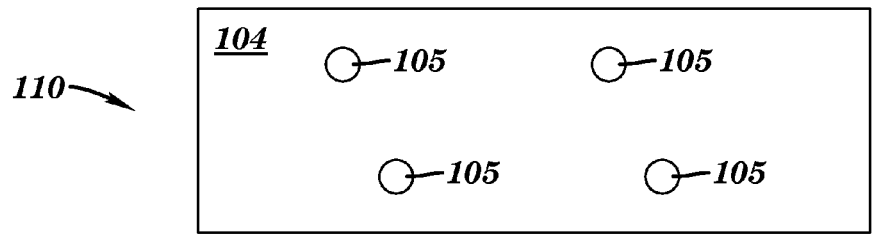

FIG. 2 illustrates a possible arrangement of the bonding surfaces of the 3D stack 100 of FIG. 1. The material of substrate 106 and 126 can be any semiconductor material including but not limited to group IV semiconductors such as silicon, silicon germanium, or germanium, a III-V compound semiconductor, or a II-VI compound semiconductor. Furthermore, substrates 106 and 126 can be bulk silicon or can comprise layers such as, silicon/silicon germanium, silicon on insulator (SOI), ETSOI (extremely thin semiconductor on insulator), PDSOI (partially-depleted semiconductor on insulator) or silicon germanium-on-insulator. The insulator layers of these can be referred to as a buried oxide (BOX) layer which can be any insulating oxide such as, e.g., silicon dioxide, or even an epitaxial oxide such as Gadolinium(III)-oxide ($Gd_2O_3$).

Bonding surface 104 of die 110 can be the top of BEOL layer 103. As such, surface 104 can include exposed regions of metal 105 which could be the topmost portion of interconnect wiring 102, or they could be pads formed exclusively as bonding structure which does not electrically connect to any devices. The remaining portion of surface 104 would be dielectric material such as oxide. Metal regions 105 can be laid out to align with metal regions 125 on the bonding surface 124 of die 120.

Surface 124 includes metal regions 125 surrounded by a field. It should be understood that FIG. 2 can represent bonding surfaces for die to die, die to wafer, or wafer to wafer bonding. Metal regions of the bonding surfaces can be as depicted in FIG. 2, with small isolated metal regions in a dielectric (or other non-metal) field, or could be more of a checkerboard or mixed line pattern. The metal regions 105 and 125 can be made from a material selected from the group consisting of copper, nickel, copper/nickel, copper/gold and copper/nickel/gold. One or more layers, e.g. a barrier layer, may separate metal regions from surrounding material but are not shown. The field material surrounding regions 125 depends on the design of die 120 and stack 100. For example, if vias 121 were etched into substrate 126 from the side opposite surface 124, but not all the way through the substrate, and then exposed by thinning the substrate to expose the metal regions 125 of vias 121, then the field could be the material of substrate 126 or it could be another material such as a passivation material. Another option is that die 120 has a BEOL layer (not shown), oriented "face to face" with BEOL layer 103, in which case the field of surface 124 could be predominantly dielectric material. It should be understood, that first and second die 110 and 120 may have similar or different structure or function, and they can be formed of similar materials such as both having a bulk silicon substrate, but there is no requirement that any analogous structure be of the same material. The metal of regions 125 can be different from that of 105, provided that they are capable of combining to permit electron delocalization, i.e., forming a metallic bond. A 3D stack can also have bonding surfaces that are primarily metal. For example U.S. Pat. No. 7,939,369, the specification of which is hereby incorporated by reference, teaches a 3D structure joined by metal to metal bonding, where a metal plane constitutes the last layer of both die to be bonded so that each bonding surface is almost completely metal.

Electroless plating according to embodiments of the present invention can be used to activate a bonding surface having isolated bonding regions (such as depicted by FIG. 2), or one comprised primarily by metal, which is to say it is applicable to joining any two structures by forming a metallic bond. Ordinarily, an electroless solution composition is carefully controlled to promote deposition of a smooth and continuous layer, and is designed to maintain clean interfaces as the plating process proceeds. The plating solution and the process controls are designed to enable and promote continuous films to the thickness required from the plating solution to produce the correct film to meet design characteristics. For example a 1 micrometer thick film may be required for a process and the electroless chemistry is designed to produce a continuous film that will achieve a 1 micrometer thickness without significant internal imperfection. The standard electroless plating solution typically includes a source of metal ions; a reducing agent, such as formaldehyde for copper deposition; additives such as to keep the metal ions in solution or a pH buffer; and a very small concentration, such as a few ppm, of a deposition poison, such as lead (Pb) ions, to stop unwanted plating on the tank or transfer equipment.

Figure 3A:
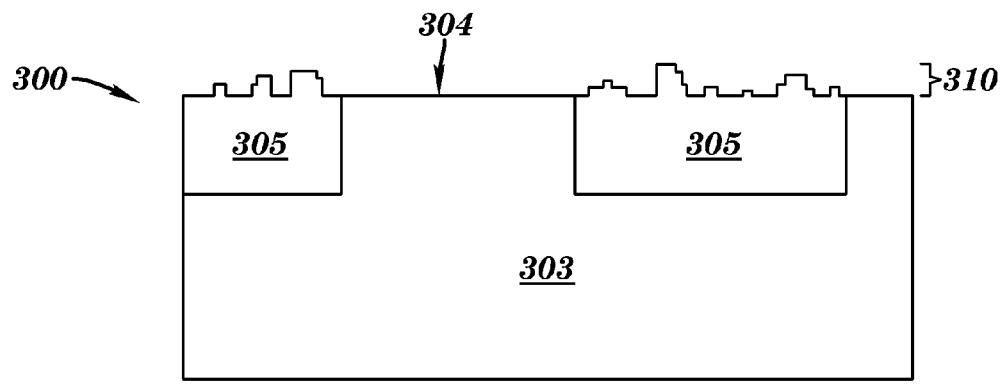
FIGS. 3A and 3B illustrate a discontinuous seed layer according to various embodiments of the invention.
Figure 3B:
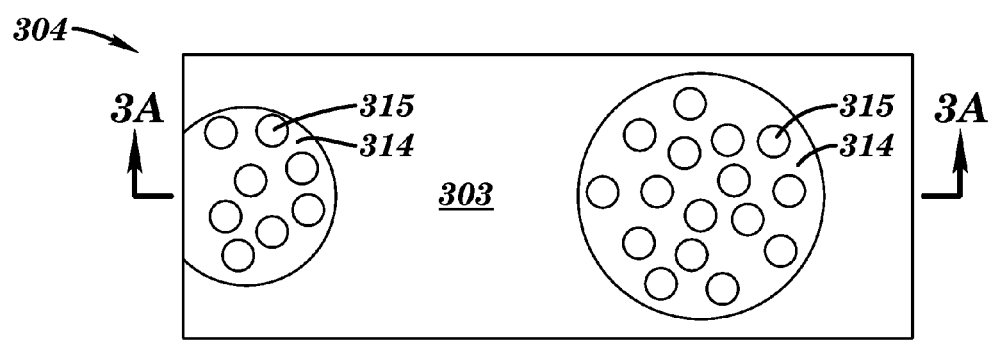

FIG. 3B illustrates the top or bonding surface 304 of a structure 300, and FIG. 3A illustrates a sideview of structure 300 along a cut at 3A. Structure 300 includes isolated metal regions 305 embedded within a non-metal material 303. Isolated metal regions 305 could be the surface, for example, of BEOL metallization, a contact pad, or a TSV. Metal regions 305 may be annealed to have large average grain size of e.g., 2.0 micron or more. According to the present invention, a thermodynamically-stable fine-textured metal layer (having small average grain size such as <1.0 or even <0.6 micron or less) can be formed on a bonding surface by electroless plating. According to a first embodiment, an activated layer (such as a fine-textured layer) 310 can be formed on metal regions 305 by exposing bonding surface 304 to a customized electroless plating solution that includes, in addition to the usual components, an inhibitor to interfere with metal deposition.

The inhibitor, which may also be referred to as a poison, can be selected from species known to inhibit or stop metal deposition. The selection and concentration of the inhibitor species depends on the resultant textured surface that is desired. For very fine grain textured surfaces, the inhibitor concentration is selected to surface adsorb and poison small regions 314 on which initial fine grains 310 will not form, at a rate comparable to deposition of fine grains 310 on to regions 315. The chemistry can be tuned so that regions 315 and 314 have roughly equivalent surface area and have a mean diameter as small as tens of nanometers. The proper inhibitor concentration appreciates competitive surface adsorption rates of the inhibitor and metal which is desired to be plated, and can be tuned for plating onto a freshly plated surface or onto a stabilized or annealed metal surface. The electroless solution may include inhibitor at a concentration as low as 100 ppm to as high as several hundred thousand ppm dependent on the reactant constant of the inhibitor relative to the reactant constant of the plating system to deposit metal. For example, the solution could include cobalt (Co) ions in a concentration between 1000 and 10000 ppm, or about 5000 ppm.

Selection of an inhibitor species depends on the particular electroless chemistry, and can be, for example, one or more of arsenic, cobalt, manganese, chromium, lead, silver, nickel or other metals, metal oxides of any of the foregoing, and can also be compounds such as, e.g., acetone, ammonium peroxydisulfate, cerium ammonium nitrate (CAN), 2-mercapto-5-benzimidazolesulfonic acid (MBIS), and bis-(3-sulfopropyl)-disulfide (SPS).

According to another embodiment, uniform metal deposition can be disrupted by interfering with the activity of the plating reducing agent. In that case, an inhibitor to the reducing agent can promote unequal rates of metal ion reduction (ie, deposition) to produce a fine textured surface. The inhibitor concentration for such embodiment could be as low as 100 ppm or several hundred ppm to as high as tens of thousands ppm dependent on the reactant constant of the inhibitor relative to the reactant constant of the plating system to deposit metal. The reducing agent inhibitor could be a non-metal or a metal compound such as a metal ion oxide, or could be, for example, arsenic within the range of 100 to 1000 ppm, or at a concentration of about 500 ppm.

According to yet another embodiment, activated layer 310 can be formed on a bonding surface 304 by forming a dispersed seed layer. Such dispersed seed layer could be formed by exposing surface 304 to a customized seed solution that includes palladium (Pd) or other seeding catalyst along with a slightly higher concentration of an inhibitor that poisons portions of the exposed surface of metal region 305 and preferentially prohibits uniform seeding. An example of such inhibitor could be, e.g. lead (Pb) or thallium (Tl), at a concentration in the range of 50 to 500 ppm. In particular embodiments the inhibitor could be in the range of 350 to 500 ppm to form seeded regions 315 within a matrix of poisoned regions 314 constituting a discontinuous seed layer. Subsequent electroless deposition can form a fine textured and durable activated layer 310 on top of the discontinuous seed layer.

The poison species will inhibit seed deposition on regions of the exposed metal, such that the seeded deposition that does occur will be a discontinuous layer. Optimally each region 315 is very small, such as just a few seed species, and region 314 has less total surface area than the aggregation of all regions 315. In a preferred embodiment, the bonding surface constitutes a finely dispersed composition, such as where the mean diameter of regions 315 (ie, the average width of a seed region) is greater than or at least the same order of magnitude as the average edge to edge distance between adjacent seed regions. Electroless deposition of layer 310, e.g., copper onto such 'dispersed seed layer' can maintain a fine grain structure for subsequent bonding because the seed layer constitutes dispersed particles of seed rather than a continuous film. When subsequently bonded, the fine grained layer 310 may anneal with or into the opposite bond surface, but the finely dispersed seed layer will remain as a very thin layer wherein the poison is at substantially higher concentration than in the bulk of the bonded material. In embodiments, the poison concentration at the interface could be more ten times or even several orders of magnitude greater than its concentration in the bulk of the bonded metal structures. In other words, the interface will include a detectible plating poison at a concentration at least one order of magnitude higher than in the adjacent metal structures. In a preferred embodiment, the poison concentration at the interface is at least three orders of magnitude greater than in the bulk of metal regions 305.

Figure 4A:
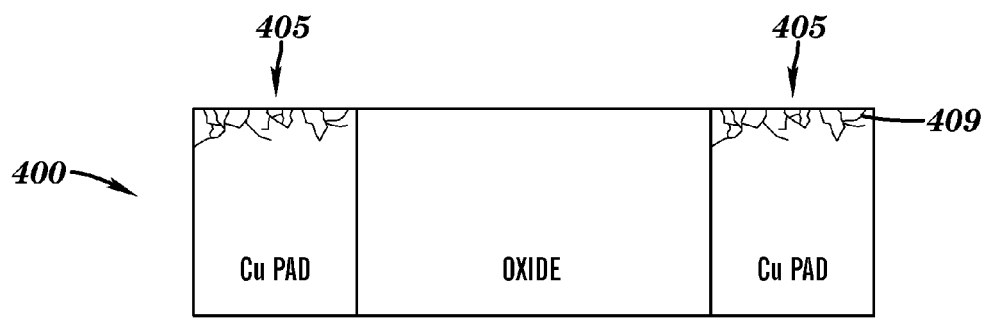
FIGS. 4A, 4B and 4C illustrate pre-treating a bonding surface according to embodiments of the invention.
Figure 4B:
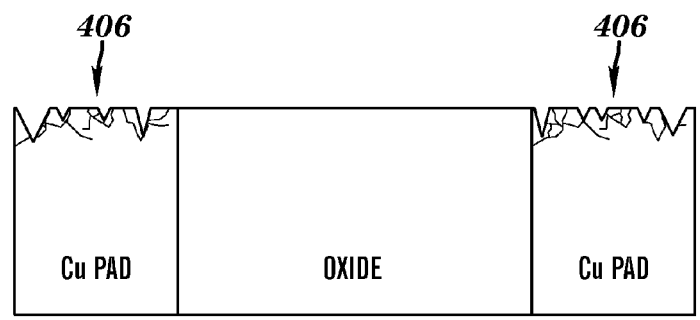
Figure 4C:
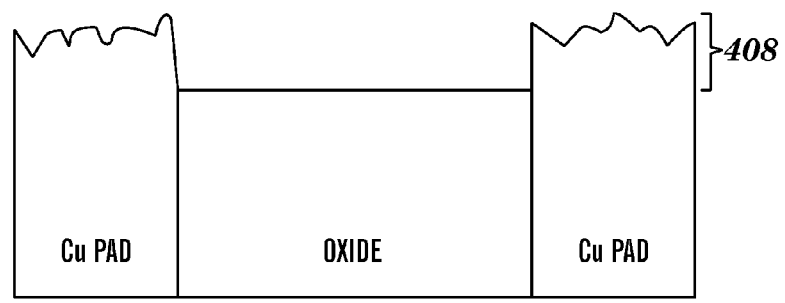

According to yet another embodiment, FIG. 4A depicts subjecting exposed metal 405 to surface pretreatment such as in $H_2O_2$, TEAH, TMAH, to promote non-uniform oxide growth 409. For example, according to FIG. 4B, a metal copper surface 406 can be roughened by pre-treatment such as by $H_2O_2$, followed by a partial surface clean with hydroxyl amine. As shown in FIG. 4C, subsequent plating a film onto such treated surface can create a durable activated layer 408 with enhanced roughness and fine grain size.

Figure 5:
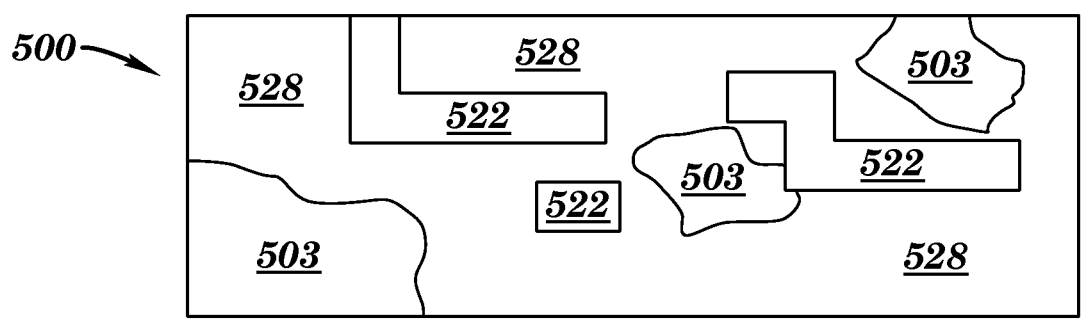
FIG. 5 illustrates an incompletely polished surface amenable to treatment by embodiments of the invention.

FIG. 5 illustrates yet another substrate 500 that can be treated according to any embodiment of this invention to form a stable activated bonding surface. Substrate 500 includes conductive pathways 522 plated to fill patterned openings in a top dielectric layer 503 where a layer 528 constitutes a current carrier for electrochemical deposition. CMP to remove excess metal can incompletely remove the barrier layer 528, exposing only small regions of dielectric 503. Surface pretreatment such as with $H_2O_2$ can promote non-uniform oxide growth on exposed metal 522 as illustrated in FIG. 4. When subsequently subjected to electroless plating, the differential thickness of this oxide growth, which can preferentially form along copper grain boundaries, is removed and exposes a rough pristine metal surface. A fine-grained bonding layer can be deposited onto the rough surface. The roughness helps to stabilize an activated layer that can be formed with a high density of dislocations and fine grain structure.

In yet a further embodiment, a contaminant such as tin or silver is included in the electroless solution. Such contaminant is selected to co-deposit with the particular metal to be deposited, so that e.g., tin dispersed in copper is deposited onto a prepared seed layer. Such deposition can be onto a seed layer formed by conventional processing or preferably onto a finely dispersed seed layer as described above. The contaminant, which may constitute from a few ppm up to several percent such as 200 ppm to 1.5%, or within the range of 0.01% to 1% of a thinly deposited layer, can pin the grain boundaries of the deposited metal and thereby enable formation of a stable fine-textured bonding layer. By inhibiting or delaying grain growth, the deposited bonding layer can maintain a fine grained microstructure and enable metal to metal bonding at lower temperature, or in less time, or both.

It will be apparent to those skilled in the art having regard to this disclosure that other modifications of the exemplary embodiments beyond those embodiments specifically described here may be made without departing from the spirit of the invention. Accordingly, such modifications are considered within the scope of the invention as limited solely by the appended claims.

What is claimed is:

1. A 3D structure comprising:
a bonding layer upon a nickel metal surface, wherein an average grain size of the bonding layer is smaller than an average grain size of the nickel metal surface, wherein the nickel metal surface is a surface of an interconnect that connects a first semiconductor die to a second semiconductor die; and
a metallic bond at an interface between the first interconnect and the second interconnect, the interface comprising a metal deposition inhibitor at a first concentration being at least one order of magnitude higher than a second concentration of the metal deposition inhibitor within the first interconnect and the second interconnect.

2. The 3D structure of claim 1, wherein the bonding layer is electrolessly plated upon the nickel metal surface.

3. The 3D structure of claim 1, wherein the nickel metal surface comprises a discontinuous seed layer.

4. The 3D structure of claim 1, wherein the nickel metal surface is rough.

5. The 3D structure of claim 1, wherein the interconnect is a through substrate via.

6. The 3D structure of claim 1, wherein the interconnect is a contact pad.

7. The 3D structure of claim 1, wherein the interconnect is a Back End of Line metallization portion.

8. The 3D structure of claim 1, wherein the bonding layer is a fine textured layer.

9. The 3D structure of claim 1, wherein the average grain size of the bonding layer is less than one micron.

10. The 3D structure of claim 1, wherein the average grain size of the bonding layer is less than 0.6 microns.

11. The 3D structure of claim 1, wherein grains of the bonding layer resists self-annealing with grains of the nickel metal surface.

12. A structure comprising:
a first semiconductor die connected to a second semiconductor die by an interconnect, the interconnect comprising a bonding layer upon a nickel metal surface, wherein an average grain size of the bonding layer is smaller than an average grain size of the nickel metal surface; and
a metallic bond at an interface between the first interconnect and the second interconnect, the interface comprising a metal deposition inhibitor at a first concentration being at least one order of magnitude higher than a second concentration of the metal deposition inhibitor within the first interconnect and the second interconnect.

13. The structure of claim 12, wherein the bonding layer is electrolessly plated upon the nickel metal surface.

14. The structure of claim 12, wherein the bonding layer is plated upon the nickel metal surface.

15. The structure of claim 12, wherein the nickel metal surface is rough.

16. The structure of claim 12, wherein the bonding layer is a fine textured layer.

17. The structure of claim 12, wherein the average grain size of the bonding layer is less than one micron.

18. The structure of claim 12, wherein the average grain size of the bonding layer is less than 0.6 microns.

19. The structure of claim 12, wherein grains of the bonding layer resist self-annealing with grains of the nickel metal surface.

* * * * *